United States Patent
White et al.

(10) Patent No.: US 6,631,257 B1
(45) Date of Patent: Oct. 7, 2003

(54) SYSTEM AND METHOD FOR A MIXER CIRCUIT WITH ANTI-SERIES TRANSISTORS

(75) Inventors: William A. White, Garland, TX (US); Geoffrey C. Dawe, Newburyport, MA (US)

(73) Assignee: Microtune (Texas), L.P., Plano, TX (US)

( * ) Notice: Subject to any disclaimer, the term of this patent is extended or adjusted under 35 U.S.C. 154(b) by 0 days.

(21) Appl. No.: 09/553,974

(22) Filed: Apr. 20, 2000

(51) Int. Cl.$^7$ ................................................ H04B 1/28
(52) U.S. Cl. .................. 455/333; 455/323; 327/355; 327/356; 327/359
(58) Field of Search ................... 455/323, 326, 455/330, 333; 327/355, 357, 359, 358, 356

(56) References Cited

U.S. PATENT DOCUMENTS

| | | | | |
|---|---|---|---|---|
| 4,306,311 | A | * | 12/1981 | Igarashi |
| 5,884,154 | A | * | 3/1999 | Sano et al. |
| 5,999,804 | A | * | 12/1999 | Forgues |
| 6,205,325 | B1 | * | 3/2001 | Groe |

OTHER PUBLICATIONS

Kinget, Peter and Michiel Steyaert. "A 1 GHz CMOS Upconversion Mixer". IEEE Custom Integrated Circuits Conference. (1996) 197–200.

Crols, Jan, and Michel S. J. Steyaert. "A 1.5 GHz Highly Linear CMOS Downconversion Mixer." IEEE Journal of Solid-State Circuits. vol. 30 No. 7 (Jul. 1995). 736–742.

Razavi, Behzad, Kwing F. Lee, Ran–Hong Yan, and Robert G. Swartz. "A 3–GHz 25–mW CMOS Phase–Locked Loop." 1994 Symposium on VLSI Circuits Digest of Technical Papers. (1994). 131–132.

Okanobu, Taiwa, Hitoshi Tomiyama, and Hiroshi Arimoto. "Advanced Low Voltage Single Chip Radio IC." IEEE Transactions on Consumer Electronics . vol. 38 No. 3. (Aug. 1992) 465–475.

"Double–balanced mixer and oscillator" Phillips Semiconductors. (Nov. 7, 1997). 1–11.

Gilbert, Barrie. "Demystifying the Mixer" Analog Devices Inc. (Apr. 1994). 1–58.

Scheinberg, N., et al. "A GaAs Up Converter Interated Circuit for a Double Conversion Cable TV "Set–Top" Tuner" International Conference on Consumer Electronics. (Jun. 1993). 108–109.

Gilbert, Barrie and Baines, Rupert. "Fundamentals of Active Mixers" Applied Microwave and Wireless. (1995). 10–27.

Nakatsuka, T., et al., "Low Distortion and Low Noise Oscillator Mixer for CATV Converters." GaAs Symposium Technical Digest. (1988). 161–164.

Brady, Vernon, et al. "Development of a Monolithic FET Ka–Band Single Side Band UFConverter and Image Reject Downconverter." GaAs Symposium Technical Digest (Oct. 1989) 189–192.

Maas. Stephen A. "A GaAs MESFET Mixer with Very Low Intermodulation" IEEE Transactions on Microwave Theory and Techniques, vol. MTT–35, No. 4. (Apr. 1987). 425–429.

Pandula, Louis. "Image Reject and Image Canceling Mixers" RF Design. (Apr. 1995). 60–65.

(List continued on next page.)

Primary Examiner—Thanh Cong Le
Assistant Examiner—Huy Nguyen
(74) Attorney, Agent, or Firm—Fulbright & Jaworski L.L.P.

(57) ABSTRACT

A system and method for a mixer circuit places the RF and mixer core LO transistors on the same level in anti-series. The mixer circuit provides increased headroom, excellent linearity, controllable conversion-gain, and operates with a reduced supply voltage requirement.

69 Claims, 5 Drawing Sheets

OTHER PUBLICATIONS

Meyer, Robert G. "Intermodulation in High–Frequency Bipolar Transistor Integrated–Circuit Mixers." IEEE Journal of Solid–State Circuits, vol. SC–21, No. 4. (Aug. 1986). 534–537.

Svelto, F., et al. "A Low–Voltage Topology After CMOS RF MIxers." IEEE Transactions on Consumer Electronics., vol. 45, No. 2 (May 1999). 299–309.

Gilbert, Barrie. "The MICROMIXER: A highly Linear Variant of the Gilbert Mixer using a Bisymmetric Class–AB Input Stage" IEEE Journal of Solid–State Circuits, vol. 32, No. 9, (Sep. 1997). 1412–1423.

Torji, K., et al. "Monolithic Integrated VHF TV Tuner." IEEE Transactions on Consumer Electronics, vol. CE–26. (May 1980). 180–189.

MC13143: Ultra Low Power DC–2.4 GHz Linear Mixer, Motorola, Inc. Issue 2. (1996). 1–8.

McDonald, Mark D. "A 2.5GHz BiCMOS Image–Reject Front–End" IEEE International Solid–State Circuits Conference. (1993). 144–145.

Lovelace, David, et al. "Silicon Upconverter RF IC Simplifies Cable Modem Designs" Microwaves & RF (Mar. 1997). 136–142.

Crols, Jan and Michiel Steyaert. "A Fully Integrated 900MHz CMOS Double Quadrature Downconverter" IEEE International Solid–State Circuits Conference. (1995). 136–137.

Sabin, William E. & Edgar O. Schoenike. "Single–Sideband Systems & Circuits." McGraw Hill Book Company. New York. (1987). 88–134, 181–213.

* cited by examiner

SYSTEM AND METHOD FOR A MIXER CIRCUIT WITH ANTI-SERIES TRANSISTORS

TECHNICAL FIELD

This invention relates generally to electronic signal processing circuits and more particularly to radio frequency (RF) mixers.

BACKGROUND

In the area of radio frequency (RF) receivers or transmitters, mixing circuits (mixers) generally perform frequency translation by multiplying two input signals, each of which may comprise a non-inverted/inverted signal pair. Typically, one input signal is a received signal containing information to be processed, and the other signal is typically a reference signal generated by the mixer or the receiver/transmitter circuits. Mixers have many varied applications. For example, mixers are commonly embodied in equipment used for sending and receiving AM/FM radio signals, both cable and broadcast television signals, and even in cable modems. Mixers may be used in systems designed to send or receive any type of information in an RF signal, such as voice, video, and data. The quality and performance of the mixer generally depends on achieving a closely linear operation and obtaining a controllable and predictable gain. In the prior art, the most commonly used active device mixer is known as the Gilbert cell. Other passive device mixers exist which use arrays of transformers and diodes. However, these passive device mixers are generally not amenable to integrated circuit design. Because its configuration is generally suitable for integrated circuit fabrication, the Gilbert cell has essentially become the standard "on-chip" mixer configuration. FIG. 1 details the circuit layout of a typical prior art Gilbert cell mixer.

Mixers perform frequency translation by multiplying two frequencies together. The graphs of FIG. 2 give a hypothetical illustration of how two signals are multiplied. We begin with the time domain representation of the two input signals $f_{RF}(t)$ 200 and $f_{LO}(t)$ 201. The local oscillator (LO) signal is, ideally, a square wave, and the RF signal is a hypothetical modulated sinusoidal waveform. Multiplication of these two signals is simplified by transforming each one into the frequency domain and convolving the two transformed signals. Convolution is well known in the art as the method of obtaining the frequency domain representation of two signals multiplied in the time domain. It is also well known in the art to transform a time domain signal into its frequency spectrum through a Fourier Transformation. $F_{RF}(\omega)$ 202 and $F_{LO}(\omega)$ 203 represent the RF and LO signals in the frequency spectrum. Convolving $F_{RF}(\omega)$ 202 and $F_{LO}(\omega)$ 203 produces the intermediate frequency (IF) output frequency spectrum $F_{IF}(\omega)$ 204. As shown by FIG. 2, the output $F_{IF}(\omega)$ 204 contains a scaled version of the RF spectrum centered at the sum of the RF harmonic frequency and the LO first harmonic frequency and another scaled version at the difference of the RF and LO harmonic frequencies. Thus, the product of two signals produces "sum-and-difference" results. If the mixer is an up-converter, the difference result is filtered out or suppressed while the sum result is processed further. Conversely, if the mixer is a down-converter, the sum result is filtered out or suppressed while the difference result is processed further.

To perform this frequency translation, the Gilbert cell, as shown in FIG. 1, typically includes a mixer core 10, an RF input section 11, and a biasing circuit (not shown). The mixer core 10 is made up of an LO switching interface 12 with input terminals LOP 100, which receives the non-inverted LO input signal, and LON 101, which receives the inverted LO input signal, and an IF output with terminals IFP 102 and IFN 103 for providing the mixer output. The LO switching interface 12 also contains two pairs of transistors, Q3 104 and Q6 107, and Q4 105 and Q5 106, wherein the Q3 104 and Q6 107 pair are each connected to input terminal LOP 100, and the Q4 105 and Q5 106 pair are each connected to input terminal LON 101. The LO switching interface 12 operates in such a way so as to quickly switch between turning Q3 104 and Q6 107 on while Q4 105 and Q5 106 are turned off, and vice versa. Therefore, at any one time, one of the transistor pairs is on and the other off.

The LO input signal which drives the switching process is ideally represented as a square wave to minimize the switching time between the two pairs of transistors. This process is normally accomplished by amplifying an LO sinusoidal signal into compression. By amplifying the signal into compression, the tops of the sinusoid are flattened out or clipped, thus approximating the attributes of a square wave.

The RF input section 11 contains input terminals RFP 108, which receives the non-inverted RF input signal, and RFN 109, which receives the inverted RF input signal; two transistors Q1 110 and Q2 111, which are arranged as an emitter coupled differential pair; a series connection from Q1 110 to the Q3 104 and Q4 105 of the mixer core 10; another series connection from Q2 111 to Q5 106 and Q6 107 of the mixer core 10; and a pull-down current source 112 connected to the differential pair Q1 110 and Q2 111. Input terminals RFP 108 and RFN 109 may also be used for receiving a biasing signal from the biasing circuit. With connections to the load resistors RLN 113 and RLP 114 through the mixer core 10 and the resistors RE1 115 and RE2 116, the differential pair Q1 110 and Q2 111 operates as a differential amplifier. Further, the active mixer core transistors (Q3 104 & Q6 107 or Q4 105 & Q5 106) create a cascode stage in the differential amplifier.

A cascode stage is generally well known in the art as an amplifier comprising a common emitter stage followed by a common base stage. For the cascode connection, either transistor of the differential pair may be considered a common emitter stage. As shown in FIG. 1, the RF transistors Q1 110 and Q2 111 each form a common emitter stage of the circuit. Which ever of the mixer core transistor pairs is activated at any one time, for example Q3 104 and Q6 107, will typically form the common base stage. Thus, the common emitter-common base connection produces a cascode configuration. In a cascode configuration, the effective load resistance, as seen by the RF transistors, i.e., the common emitter stage, is not the value of load resistors, here RLN 113 and RLP 114, but rather, is typically the much lower input resistance of the transistors Q3 104 and Q6 107.

The addition of the cascode stage in the Gilbert cell generally helps avoid frequency response attenuation caused by Miller effect in the common emitter stage. Miller effect arises in the general situation where there is an impedance straddling the input and output terminals of an active network (assuming the impedance does not affect the voltage gain of the network). Miller's Theorem shows that this straddling impedance is equivalent to the sum of two "Miller" impedances which do not straddle the input and output terminals (i.e., one in the input circuit and one in the output circuit). The values of these input and output "Miller" impedances depend, in general, on both the value of the original straddling impedance and the network's voltage gain. In effect, a small impedance straddling the input/output terminals may be equivalent to an input impedance many times the original straddling impedance value. In the situation of a capacitance, the influence of the straddling capacitance, based on Miller effect, may have an enormous effect on the transistor's high frequency behavior.

A transistor typically has an inherent capacitance between the base and collector, which, in a common emitter configuration, results in effectively straddling the input/output terminals. Because the value of this inherent capacitance will generally be fixed depending on the particular transistor, the voltage gain of the common emitter stage will usually provide a greater influence on the value of the equivalent "Miller" input impedance. Because of its configuration, voltage gain across a common emitter will generally depend on the value of the load impedance/resistance. With a cascode configuration, the low load resistance, as seen from the common emitter stage, typically reduces the voltage gain which would then reduce the Miller effect. Therefore, the Gilbert cell's cascode configuration helps reduce the frequency response attenuation which typically affects common emitter circuits.

The Gilbert cell also includes a biasing circuit with a bias output connected to the RF biasing input terminals for providing the appropriate biasing signal to the RF input section.

In operation, the Gilbert cell's LO switching interface 12 alternates quickly switching its transistors on and off, which, in turn, provides alternating paths to the IF outputs for the RF signals at RFP 108 and RFN 109. As shown in FIG. 3, the IFP output signal 300, therefore, alternates between the non-inverted RFP signal 302 and inverted RFN signal 303, while the IFN output signal 301, conversely, alternates between the inverted and non-inverted RF signals. The resulting output signal waveform is the sum-and-difference product of the LO and RF input signals. Appropriate selection or manipulation of the LO input signals LOP 304 and LON 305 will typically produce the desired IF output signal.

Ideally, the IFP and IFN output signals 300 and 301 should be exact mirrored images of each other. This mirrored attribute results from the pure sum-and-difference product of the signals, the symmetry and balance in the mixer circuit, and the balance of both the LO and RF input signals. Without symmetry or balance, distortion increases in the output signal due to portions of the original LO and/or RF frequencies translating through to the IF output signal, a phenomenon known as "feed-through". LO and RF signal balance means that there is little or no DC component of the differential signal. In other words, the LO signals at the LO inputs must be centered around the same DC level. If not, then, in the mixing process, in addition to the pure LO/RF sum-and-difference product, there is a DC component of the LO signal multiplied by the RF signal, which results in the RF feed-through added to the IF output signal. The same applies for LO feed-through where the RF signal is not balanced. Thus, to prevent LO/RF feed-through, both LO and RF signals must be balanced. This technique for suppressing LO/RF feed-through is generally known in the art as double balancing, and mixers which use it are generically referred to as double-balanced mixers.

In addition to the double balancing attribute, the circuit's devices should also match as closely as possible. Because the Gilbert cell is designed as a differential amplifier, the transistors of the differential pair, Q1 101–Q2 111, from FIG. 1, should ideally have identical device specifications. Generally, the further from identical the device specifications get, the more distortion results in the IF output. In the current state of the art, it is possible to achieve very nearly identical device specifications which helps minimize distortion in the IF output.

The Gilbert cell configuration generally provides a closely linear operation even though the transistors which make up the differential and cascode stages are nonlinear devices. The differential setup generates a compensating effect on the nonlinear response of transistors, Q1 110 and Q2 111. As Q1 110 shuts off, Q2 111 turns on, thereby passing each other's nonlinear response paths going in opposite directions. The net effect of this property creates a joint response which is more nearly linear than each transistor's individual response.

The Gilbert cell mixer also typically produces controllable and predictable gain. Because it is configured as a differential common emitter amplifier, gain is generally determined by the ratio of the load resistors, RLP 114 or RLN 113, to the emitter resistors, RE1 115 or RE2 116. Therefore, virtually any level of gain may be obtained by appropriate selection of the resistance values.

With all of the advantages of the Gilbert cell configuration, it still possesses limitations in its application. One problem is that the supply voltage to the cell must be divided across four circuit levels. The load resistors, LO transistors, RF transistors, and pull-down current source are connected in series. The constant DC current flowing through the load resistors causes a corresponding voltage drop. The LO transistors Q3 104 through Q6 107 and pull-down current source 112 also require a certain voltage level to operate properly. Thus, the processing RF transistors Q1 110 and Q2 111 must be biased from the remaining voltage. For example, if the voltage drop across the load resistor and pull-down current source is 0.5 volts each and each transistor requires two volts for proper operation, five volts is required just to drive the circuit. Considering that the standard supply voltage is five volts, the available headroom is severely limited.

Headroom, as that term is generally known in the art, typically refers to the available peak-to-peak signal amplitude that an amplifier can produce without clipping the top or bottom of the signal peaks. In a common emitter amplifier, the DC operating voltage (Vce at the operating or "Q" point) is limited at one end by the voltage at which the transistor enters its saturation region and at the other end by the supply voltage, Vcc. The output signal typically alternates about the DC operating voltage. Because the amplifier cannot produce a response which exceeds its limits, the peaks of an output signal cannot exceed either the supply voltage or the saturation voltage without being clipped. Therefore, the closer the operating voltage is to either limit, the smaller the unclipped peak-to-peak signal output can be, which results in limited headroom.

Another problem with the prior art mixer is the distortion caused by the cumulative nonlinear effects of the differential and cascode stage transistors. While distortion due to the differential pair is small because of its natural compensating effect, the signal must still travel through non-differential cascode stage transistors. Thus, the small distortion from the differential pair is substantially increased by the cascode stage transistors. When processing higher frequency ranges or needing a more precise or accurate solution, the distortion attributable to the Gilbert cell arrangement becomes significant.

It would therefore be desirable to have a mixer circuit with increased headroom and improved linearity over the prior art system.

SUMMARY OF THE INVENTION

These features are achieved by a system and method which combines the mixer core transistors and the RF input circuit transistors on the same circuit level, i.e., in anti-series. Compared to a series connection, in which devices are connected together at one node and share the same current and a pro ratable portion of the voltage across the connected devices; or a parallel connection, in which the devices are directly connected at two nodes and share the same voltage across each connected device; an anti-series connection connects devices in such a way that they are connected at one node, but do not necessarily share a pro ratable portion of a voltage drop. Instead, the devices are on the same circuit level, but without necessarily being parallel. Thus, the voltage drop across each device is not necessarily equal, as in a parallel connection, but also does not necessarily add up to the total voltage drop across the level, as in a series connection. Removing the series connection across the total available supply voltage increases headroom by effectively raising the available operating voltage for both the RF and LO transistors and increases the linearity of the mixer's response by eliminating the non-differential cascode stage.

To realize these desirable characteristics, the present invention includes a first and second pair of LO transistors connected respectively to a first and second LO input terminal. It also includes a first RF transistor which is connected to a first RF input terminal and connected in anti-series to the first one of the first pair and to the first one of the second pair of LO transistors. It has a second RF transistor which is connected to a second RF input terminal and connected in anti-series to the second one of the first pair and to the second one of the second pair of LO transistors. It also has two IF outputs. One of the IF outputs is connected to the outputs of both the first one of the first LO transistor pair and the second one of the second LO transistor pair. The other IF output is connected to the outputs of both of the remaining LO transistors.

The present invention produces the desirable characteristics through a method for mixing signals, wherein the circuit receives an RF signal to be mixed. An LO signal is used to continuously alternate switching between enabling the first pair of LO transistors while the second pair is disabled and enabling the second pair of LO transistors while the first pair is disabled. Depending on which of the LO transistor pairs is enabled, the LO and RF transistors form two differential pair amplifiers. The present invention outputs the signal produced by the two differential pairs as the IF signal.

It is an advantage of a preferred embodiment of the present invention to provide a mixer with increased headroom for any given supply voltage. Because the RF and LO transistors operate in anti-series, as opposed to the prior art series configuration, the available operating voltage of the differential amplifiers is now generally increased. This increase in available operating voltage actually increases the headroom for signal processing.

It is another advantage of a preferred embodiment of the present invention to improve the linearity of the mixer's response. The present invention mixes the signals through two differential pairs on the same circuit level. The prior art system directs the signals through the differential RF stage transistors and then through the non-differential cascode stage transistors before outputting the final IF signal. The present invention increases the linearity of the mixer response by eliminating any non-differential transistor processing.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION

A preferred embodiment of the present invention achieves the increased headroom and improved linearity by choosing an anti-series configuration for the mixer's transistors. The inventive mixer circuit, shown in FIG. 4A, has a first pair of LO transistor devices, Q3 406 and Q5 409, connected to a first LO input terminal, LOP 401, and a second pair of LO transistor devices, Q4 407 and Q6 410, connected to a second LO input terminal, LON 402. It has a first RF transistor device, Q1 405, connected to a first RF input terminal, RFP 403, and connected in anti-series to both the first one of the first pair of LO transistor devices, Q3 406, and the first one of the second pair of LO transistor devices, Q4 407; and a second RF transistor device, Q2 408, connected to a second RF input terminal, RFN 404, and connected in anti-series to both the second one of the first pair of LO transistor devices, Q5 409, and the second one of the second pair of LO transistor devices, Q6 410. It also has two IF output terminals: IFP 411, which is connected to the outputs of both the first one of the first pair of LO transistor devices, Q3 406, and the second one of the second pair of LO transistor devices, Q6 410; and IFN 412, which is connected to the outputs of both the second one of the first pair of LO transistor devices, Q5 409, and the first one of the second pair of LO transistor devices, Q4 407.

Figure 4A:
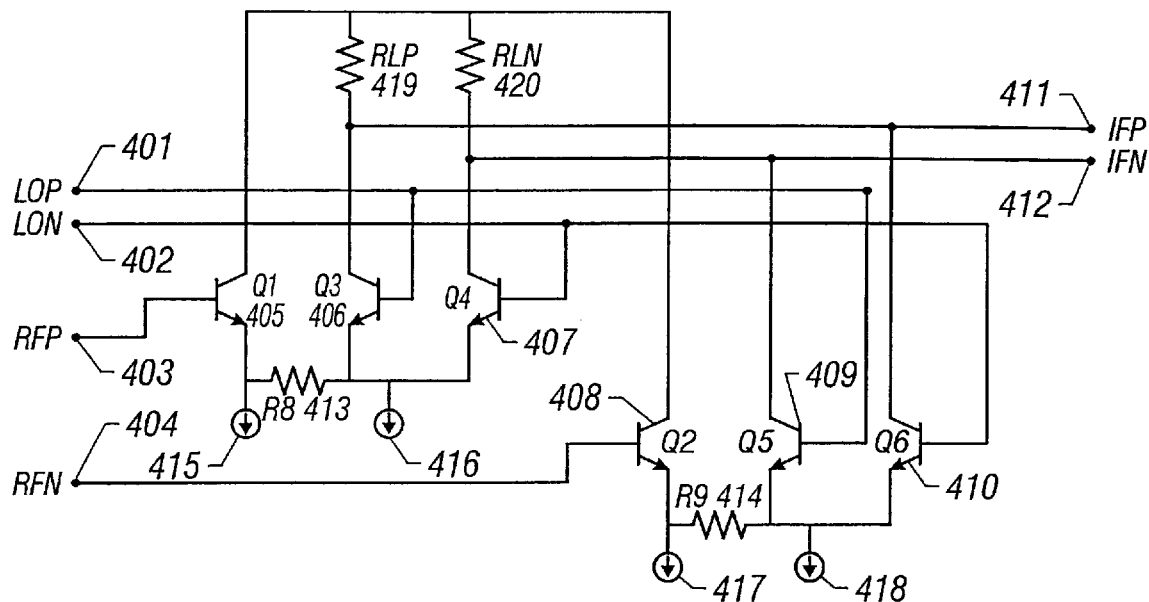
FIG. 4A is a circuit diagram illustrating the inventive mixer circuit.

With the introduction of an LO signal to the LO input terminals, the LO transistor devices begin alternately switching on and off. At any one time, therefore, either Q3 406 and Q5 409 are on while Q4 407 and Q6 410 are off, or vice versa. Each of the RF transistors will then form a differential pair with whichever of the LO transistors is on, producing two separate emitter coupled differential pairs. Specifically, Q1 405 forms a differential pair with the active of Q3 406 or Q4 407, and Q2 408 forms a differential pair with the active of Q5 409 or Q6 410. As shown in FIG. 4A, these emitter coupled differential pairs operate in anti-series.

The two differential pairs become two differential amplifiers with the connection to the load resistors, RLP 419 and RLN 420; the shared emitter resistors, R8 413 and R9 414; and the constant pull-down current sources 415, 416, 417, and 418. Gain is typically predictable in differential common emitter amplifiers and is generally controlled by the ratio between the load and emitter resistors. Therefore, virtually any desired gain may be obtained by selecting the appropriate resistance values.

Figure 1:
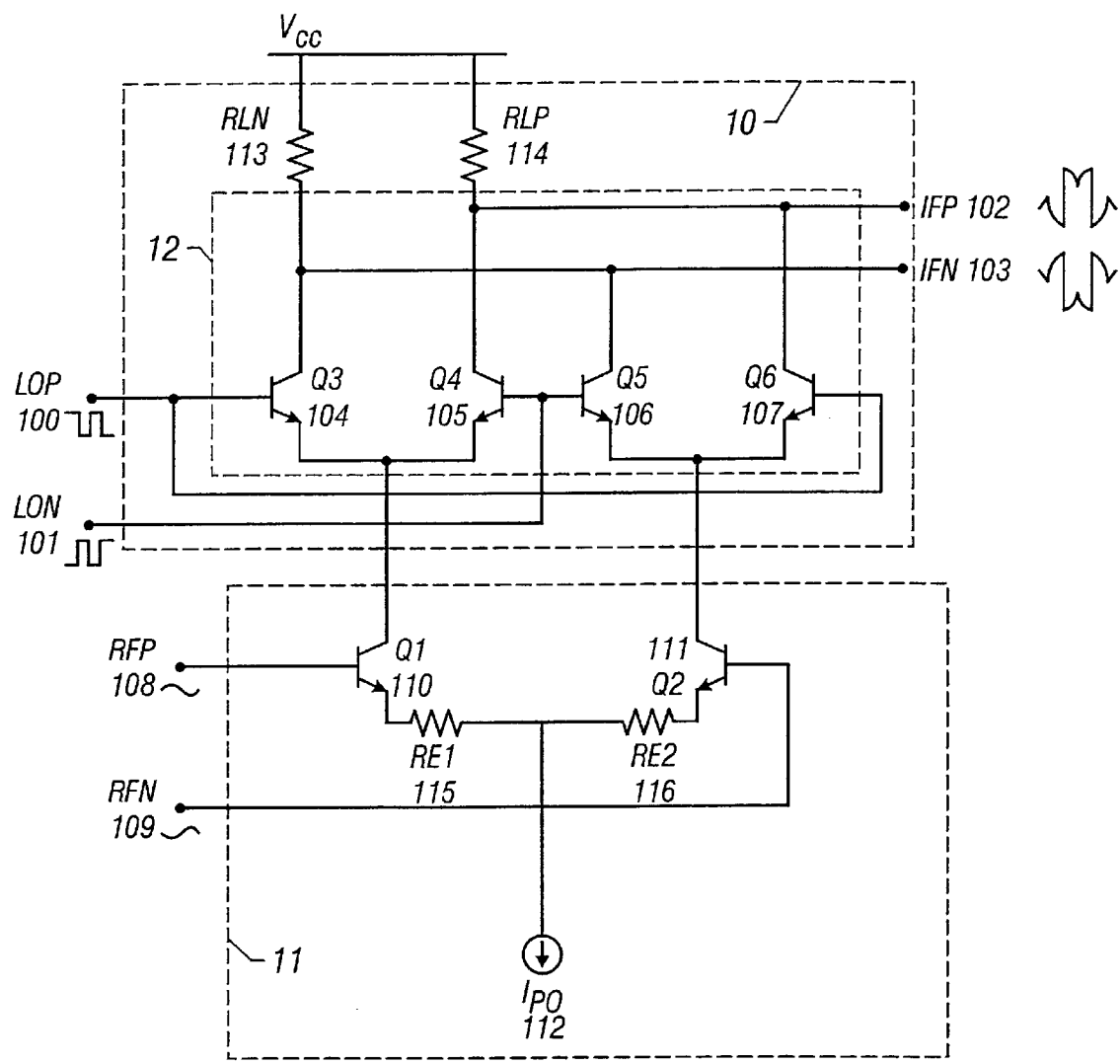
FIG. 1 is a circuit diagram illustrating the prior art Gilbert cell configuration.
Figure 2:
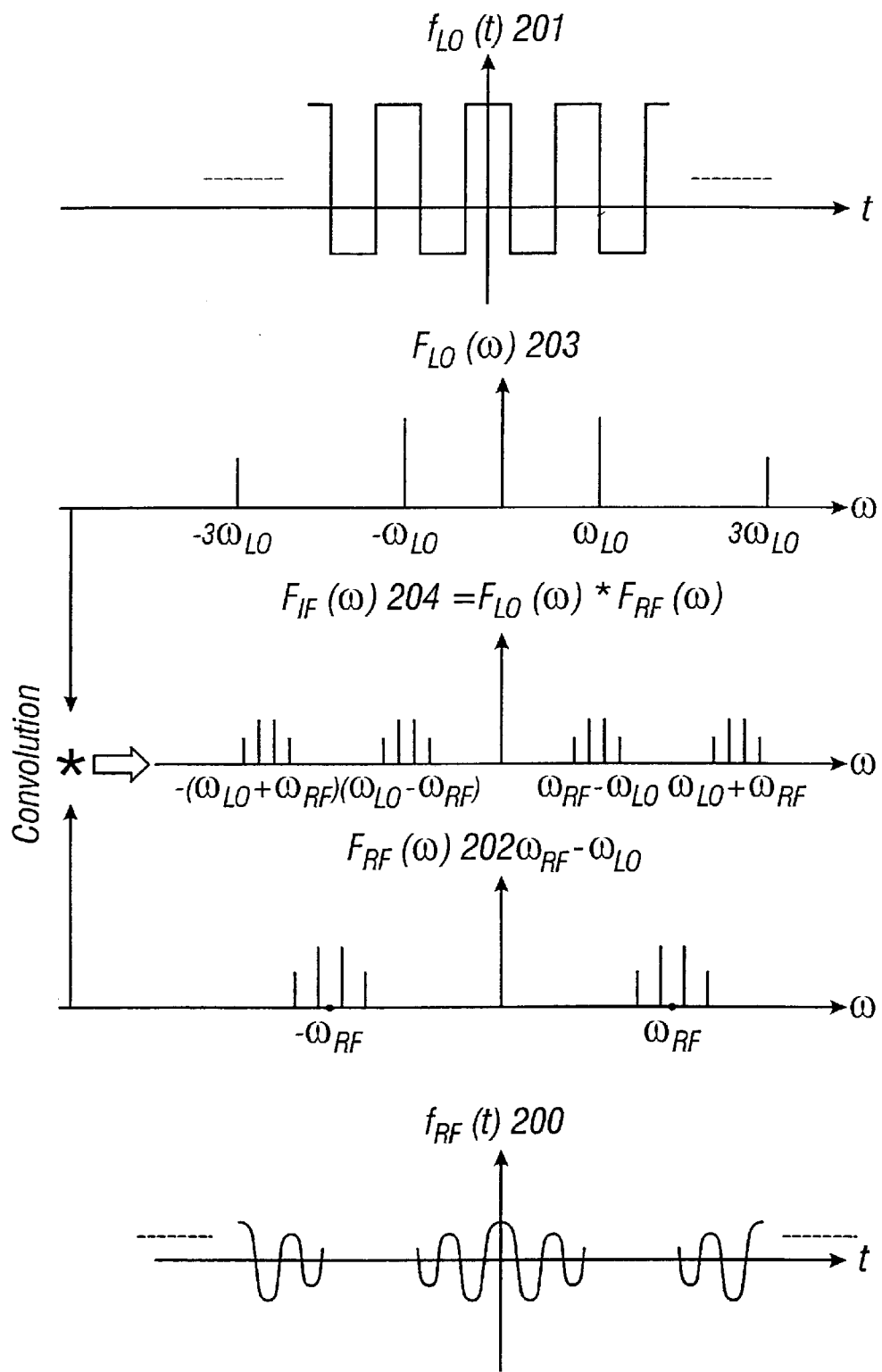
FIG. 2 is a set of graphs which hypothetically illustrate the mixing process.

The outputs of the two differential amplifiers are connected directly to the IF output terminals. As will be recalled from the prior art of FIG. 1, the Gilbert cell directs the output of the RF differential amplifier through a cascode stage before outputting the signal. This added step, which is inherent in the Gilbert cell series connection, reduces Miller effect but adds distortion to the final stage due to the nonlinearity of the cascode stage transistors. The embodiment of the present invention shown in FIG. 4A eliminate the cascode stage distortion of the prior art by directly connecting the outputs of the differential amplifiers, which, as discussed previously, produces a compensated, nearly linear response, directly to the IF output terminals. Additionally, the configuration of the present invention shown in the FIG. 4A embodiment practically eliminates any Miller effect because the collectors of the RF transistors, Q1 405 and Q2 408, are connected to signal ground and, therefore, see virtually no load resistance.

It should be noted that in alternative embodiments, the transistors Q1 405, Q3 406, and Q4 407, may connect to only one constant pull-down current source through their coupling terminals. Additionally, the amplifier configuration of Q1 405, Q3 406, and Q4 407, is not limited to only one shared impedance. Multiple variations between one pull-down current source with many shared impedances or multiple pull-down current sources with multiple or singular shared impedances may be used and are within the scope of the present invention. The same applies to the Q2 408, Q5 409, and Q6 410 transistors and amplifier configuration.

Figure 4B:
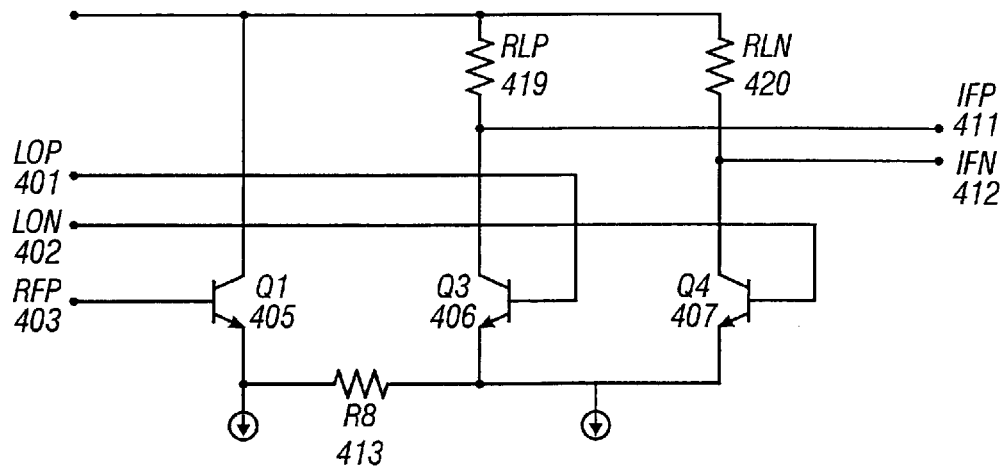
FIG. 4B is a circuit diagram illustrating an alternative embodiment of the inventive mixer circuit.

It should also be noted that an alternative embodiment of the present invention may use only a single half of the complementary RF amplifier pair. In such a single or "unbalanced" configuration, as shown in FIG. 4B, only one RF transistor, Q1 405, is connected to the LO transistors, Q3 406 and Q4 407. Load impedances, RLP 419 and RLN 420, are connected, respectively, to the collector terminals of Q3 406 and Q4 407, with emitter impedance, R8 413, commonly joining the emitter terminals of the transistors, Q1 405, Q3 406, and Q4 407. Pull-down current source 415, preferably is connected to the emitter of Q1 405, while pull-down current source 416, is connected to the emitter terminals of Q3 406 and Q4 407. However, as indicated previously, the three transistors, may share a common pull-down current source (not shown) or any combination of multiple or singular current sources with multiple or singular impedances. The two LO transistors would still preferably be driven by LO inputs, LOP 401 and LON 402, respectively, with the RF input applied to the circuit through RFP 403. The output of the alternative, unbalanced circuit configuration would still preferably be taken from IFP 411 and IFN 412.

Figure 5:
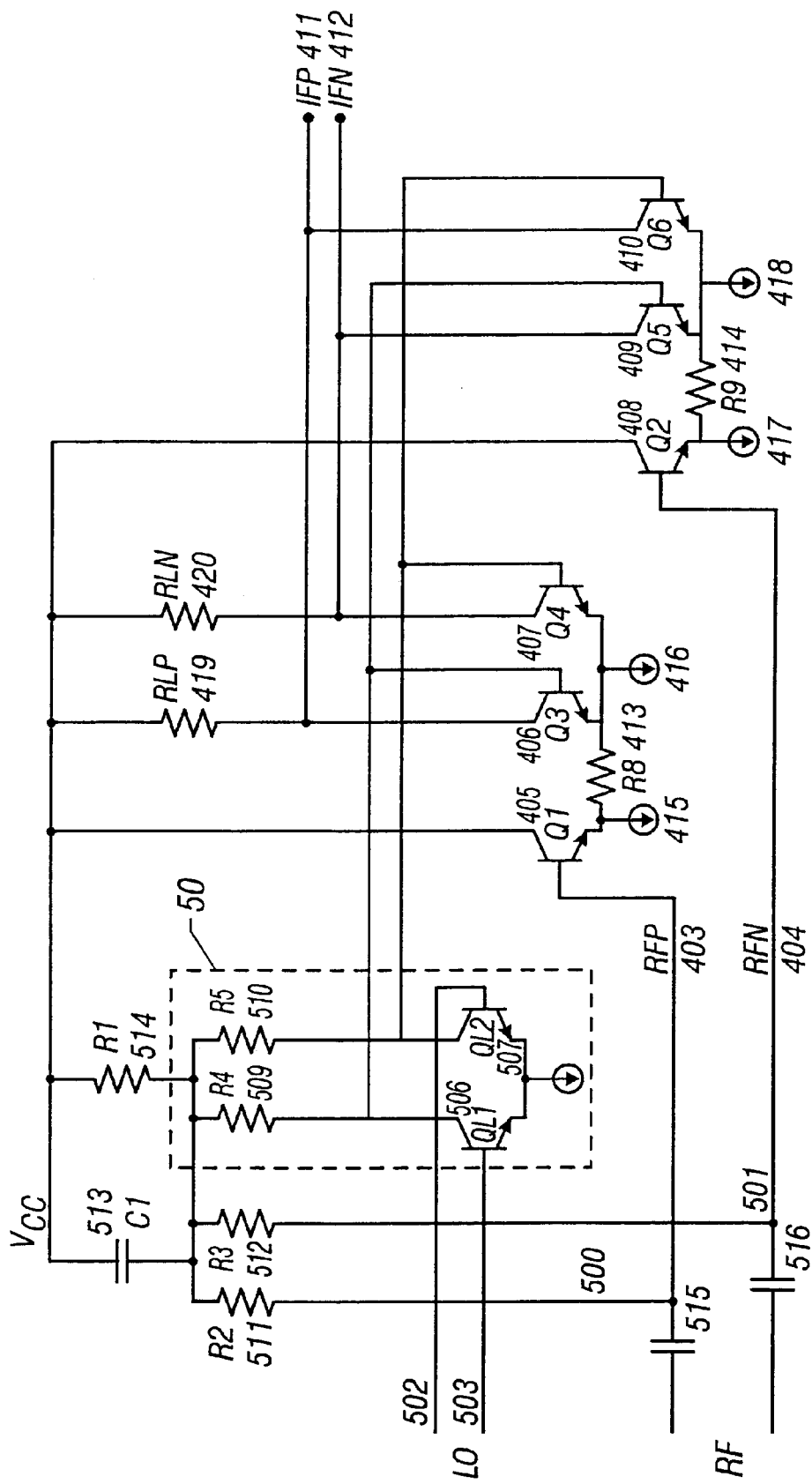
FIG. 5 is a circuit diagram illustrating the inventive mixer circuit with the preferred biasing circuit embodiment.

In typical mixer cells, the RF input terminals are usually connected to AC coupling capacitors as seen in FIG. 5, capacitors 516 and 515. The presence of these coupling capacitors, which block DC signals, requires biasing the subsequent transistors to ensure proper operation. While any number of different biasing circuit designs are feasible and are within the scope of the present invention, a preferred embodiment will be shown below.

Figure 3:
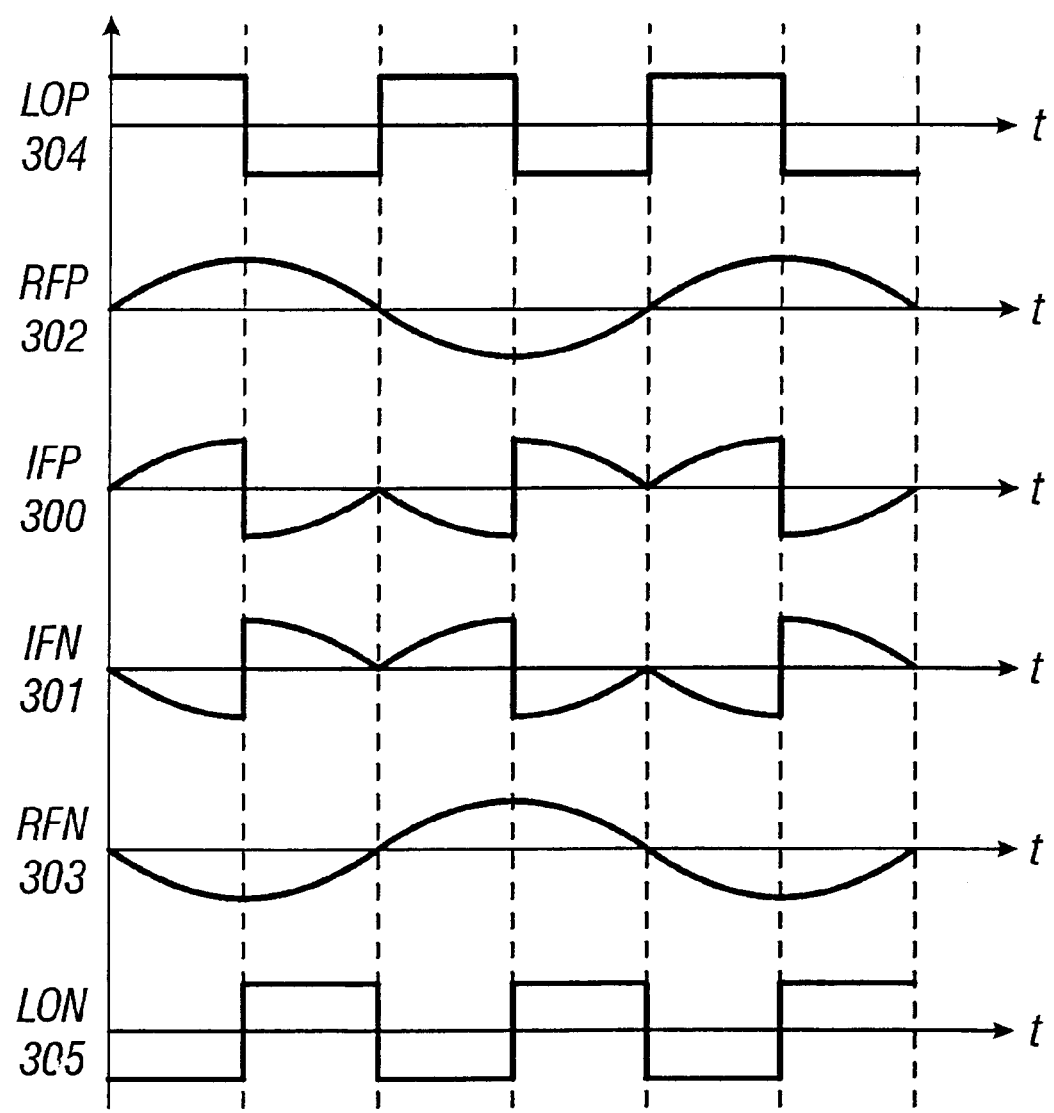
FIG. 3 is a set of graphs which hypothetically illustrate the signal processing performed by a mixer.

In operation of the preferred embodiment of the present invention shown in FIG. 4A, the LO input signal alternately switches on and off LO transistors, Q3 406–Q5 409 and Q4 407–Q6 410. The RF input terminals typically receive the RF input signals. Assuming a case where the Q3 406 and Q5 409 LO transistors are on initially, as shown in the signal graphs of FIG. 3, the corresponding signal path through Q3 406 and Q5 409 provide the output signal IFP 300 with the non-inverted RF signal RFP 302. As Q3 406 and Q5 409 are switched off and Q4 407 and Q6 410 are activated, the output signal IFP 300 switches to the inverted RF signal RFN 303. This process usually continues as long as the LO signal is provided or the RF signal continues. The output signal IFP 300, therefore, typically alternates between the non-inverted and inverted RF signals with the frequency of the switching dependent on the LO signal frequency. Conversely, the output signal IFN 301 alternates between the inverted and non-inverted RF signals. This sequence generally produces the same sum-and-difference output signals as the prior art configuration as can be seen in FIG. 3.

Because the RF and LO transistors generally operate on the same circuit level, the required operating voltages are typically no longer added in series in relation to the supply voltage. In the example from the preceding section, assuming the same five volt standard supply voltage, the 0.5 volt drop across both the lead resistor and the pull-down current source, and the two volts required for the RF and LO transistors' operating voltages, the embodiment of the present invention shown in FIG. 4A may operate with only three volts instead of the five required for the prior art configuration. For supply voltages greater than the minimum, this anti-series connection increases the available operating voltage, thereby increasing the available headroom.

Furthermore, the RF transistors, although requiring only two volts for proper operation, would actually have 2.5 volts available with the minimum three volt supply and 4.5 volts available with the standard five volt supply. This is because they are generally connected across both the load resistor and LO transistor. The higher RF transistor voltage decreases the collector-base junction capacitance which helps reduce frequency response attenuation.

In a preferred embodiment of the biasing circuit for the present invention, the circuit both provides the appropriate biasing signals for the RF interface and drives the LO transistor switching at the same time, thus increasing the simplicity and space constraints of the entire design. FIG. 5 shows the inventive mixer circuit attached to the preferred LO/biasing circuit embodiment.

As shown in FIG. 5, the preferred embodiment of the LO/biasing circuit has biasing output terminals 500 and 501; signal inputs 502 and 503; an output interface 504 and 505; and an LO signal processing cell 50. The LO signal processing cell 50 preferably includes two transistors, QL1 506 and QL2 507, arranged in an emitter coupled differential pair which forms the basis of a limiting amplifier. The base terminals of the differential pair are preferably each respectively connected to one of the signal inputs 502 and 503. The emitter terminals of the differential pair are preferably coupled together and to a constant pull-down current source 508, while the collector terminals are preferably connected respectively to one of the load resistors R4 509 and R5 510, and to the output interface 504 and 505. R4 509 and R5 510 are preferably connected to the resistors R2 511 and R3 512. R2 511 and R3 512 are preferably respectively connected to one of the biasing output terminals 500 and 501. The resistors R2 511, R3 512, R4 509, and R5 510 are preferably connected in series to capacitor, C1 513, and resistor, R1 514, which are preferably connected together in parallel. C1 513 and R1 514 are then preferably connected to the present invention through transistors Q3 406, Q4 407, Q5 409, and Q6 410.

In operation of the preferred LO/biasing circuit as shown in FIG. 5, an LO sinusoidal signal, which generally must be big enough to drive QL1 506 and QL2 507 to their limit, is introduced into the signal inputs 502 and 503. The action of the limiting amplifier typically flattens or clips the tops of the original LO signal, thus, making it approach the characteristics of a square wave. As seen in FIG. 5, the peak voltage level of the square wave is generally set by the voltage at the bottom of R1 514. That voltage is fixed typically due to the constant current running through R1 514 from the constant pull-down current source 508. QL1 506 and QL2 507 then alternate passing a square wave signal with the R1 514 peak voltage from the output interface 504 and 505 to the present invention. This signal enters the present invention through LO input terminals, LOP 401 and LON 402, both providing the LO signal and biasing the activated LO transistors at the R1 514 peak voltage.

In a differential amplifier, the best performance is generally achieved by biasing the transistor pair at the same voltage. This balanced bias will typically provide the maximum dynamic range or the signal processing. Because the voltage biasing the active LO transistors is generally available at the bottom of R1 514, it may easily be applied to bias the RF transistors through biasing resistors R2 511 and R3 512. In the preferred embodiment shown in FIG. 5, the biasing signals are provided to the present invention through the RF input terminals, RFP 403 and RFN 404. These input terminals may provide both signal input and biasing input to the present invention at the same time. Therefore, the preferred embodiment of the LO/biasing circuit provides the present invention with an LO input signal and balanced biasing voltages. This configuration typically provides the operational requirements of the present invention through a minimum of added devices, power, and complexity.

FIGS. 4A and 5 illustrate the preferred embodiments using bipolar transistors. It should be noted that in alternative embodiments, MOS-, JFET, or other types of transistors may be used in place of the bipolar transistors.

Additionally, constant pull-down current sources may be implemented in any number of ways which are well known in the art and are within the scope of this invention.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A mixer circuit comprising:
   a first pair of local oscillator (LO) transistor devices each having an input connected to a first LO input terminal for receiving LO signals;
   a second pair of LO transistor devices each having an input connected to a second LO input terminal for receiving LO signals;
   a first radio frequency (RF) transistor device:
      having an input connected to a first RF input terminal for receiving RF signals; and
      connected in anti-series to a first one of said first pair of LO transistor devices and a first one of said second pair of LO transistor devices;
   a second RF transistor device
      having an input connected to a second RF input terminal for receiving RF signals; and
      connected in anti-series to a second one of said first pair of LO transistor devices and a second one of said second pair of LO transistor devices;
   a fist intermediate frequency (IF) output terminal connected to an output of said first one of said first pair of LO transistor devices and an output of said second one of said second pair of LO transistor devices, said first IF output terminal for outputting IF signals; and
   a second IF output terminal connected to an output of said first one of said second pair of LO transistor devices and an output of said second one of said first pair of LO transistor devices, said second IF output terminal for outputting IF signals.

2. The mixer circuit of claim 1 constructed substantially on a single integrated circuit substrate.

3. The mixer circuit of claim 1 further comprising a biasing circuit for biasing said first and second RF transistor devices.

4. The mixer circuit of claim 3 constructed substantially on a single integrated circuit substrate.

5. The mixer circuit of claim 1 further comprising an LO signal generating circuit.

6. The mixer circuit of claim 5 constructed substantially on a single integrated circuit substrate.

7. The mixer circuit of claim 1 further comprising:
   a first constant current source connected to a common terminal of said first RF transistor device; and
   a second constant current source connected to a coupling terminal of said first one of said first pair of LO transistor devices and said first one of said second pair of LO transistor devices.

8. The mixer circuit of claim 7 further comprising:
   a third constant current source connected to a common terminal of said second RF transistor device; and
   a fourth constant current source connected to a coupling terminal of said second one of said first pair of LO transistor devices and said second one of said second pair of LO transistor devices.

9. The mixer circuit of claim 8 further comprising:
   a first shared impedance connected between said first and second constant current sources; and
   a second shared impedance connected between said third and fourth constant current sources.

10. The mixer circuit of claim 9 further comprising:

a first load impedance connected between said output of said first one of said first pair of LO transistor devices and a supply voltage;

said first load impedance also connected between said output of said second one of said second pair of LO transistor devices and said supply voltage;

a second load impedance connected between said first one of said second pair of LO transistor devices and said supply voltage; and said second load impedance also connected between said output of said second one of said first pair of LO transistor devices and said supply voltage.

11. The mixer circuit of claim 10 constructed substantially on a single integrated circuit substrate.

12. The mixer circuit of claim 1, wherein said transistor devices are MOS transistors.

13. The mixer circuit of claim 1, wherein said transistor devices are bipolar transistors.

14. The mixer circuit of claim 1 further comprising:

a biasing circuit for biasing said first and second RF transistor devices; and an LO signal processing circuit.

15. The mixer circuit of claim 14, wherein said biasing circuit and said LO signal processing circuit are a single circuit comprising a limiting amplifier having:
a pair of transistor devices connected as a differential pair;
a constant current source connected to a coupling terminal of said pair of transistor devices;
a pair of signal inputs for receiving an LO signal connected respectively to said pair of transistor devices;
a plurality of load impedances connected respectively to said pair of transistor devices; and
a pair of LO output terminals connected respectively to said pair of transistor devices and further connected to said LO input terminals;

a plurality of biasing impedances connected to each other at a single node and further connected to said load impedances of said limiting amplifier at said single node;

a pair of bias output terminals connected to one of said biasing impedances and to said first and second RF input terminals; and a plurality of circuit impedances:
connected to each other in parallel; and
further connected in series between said biasing impedances and said load impedances of said limiting amplifier and said supply voltage.

16. The mixer circuit of claim 15 constructed substantially on a single integrated circuit substrate.

17. The mixer circuit of claim 1, wherein said LO signals are an inverted/non-inverted signal pair.

18. The mixer circuit of claim 1, wherein said RF signals are an inverted/non-inverted signal pair.

19. The mixer circuit of claim 18, wherein said transistor devices are MOS transistors.

20. The mixer circuit of claim 18, wherein said transistor devices are bipolar transistors.

21. The mixer circuit of claim 1, wherein said IF signals are an inverted/non-inverted signal pair.

22. A method for mixing signals comprising the steps of:
receiving a radio frequency (RF) signal;
processing a local oscillator (LO) signal to continuously alternate switching between:
enabling a first pair of LO transistor devices, wherein a first one of said first pair of LO transistor devices is coupled in anti-series with a first RF transistor device and a second one of said first pair of LO transistor devices is coupled in anti-series with a second RF transistor device, wherein said enabled first pair of LO transistor devices forms two differential pairs respectively with said first and second RF transistor devices;
disabling a second pair of LO transistor devices while said first pair of LO transistor devices are enabled;
enabling said second pair of LO transistor devices, wherein a first one of said second pair of LO transistor devices is coupled in anti-series with said first RF transistor device and a second one of said second pair of LO transistor devices is coupled in anti-series with said second RF transistor device, wherein said enabled second pair of LO transistor devices forms two differential pairs respectively with said first and second RF transistor devices; and
disabling said first pair of LO transistor devices while said second pair of LO transistor devices are enabled; and
outputting a signal produced by said two differential pairs.

23. The method of claim 22 performed substantially on a single integrated circuit substrate.

24. The method of claim 22 further comprising the step of processing a biasing signal to bias said first and second RF transistors.

25. The method of claim 24, wherein said processing said LO signal step and said processing said biasing signal step are performed by a single circuit.

26. The method of claim 25 performed substantially on a single integrated circuit substrate.

27. The method of claim 22 further comprising the step of receiving a biasing signal.

28. A mixer circuit comprising:
means for receiving radio frequency (RF) signals;
means for processing local oscillator (LO) signals to continuously alternate switching between:
enabling a first pair of LO transistor devices, wherein a first one of said first pair of LO transistor devices is coupled in anti-series with a first RF transistor device and a second one of said first pair of LO transistor devices is coupled in anti-series with a second RF transistor device, wherein said enabled first pair of LO transistor devices forms two differential pairs respectively with said first and second RF transistor devices;
disabling a second pair of LO transistor devices while said first pair of LO transistor devices are enabled;
enabling said second pair of LO transistor devices, wherein a first one of said second pair of LO transistor devices is coupled in anti-series with said first RF transistor device and a second one of said second pair of LO transistor devices is coupled in anti-series with said second RF transistor device, wherein said enabled second pair of LO transistor devices forms two differential pairs respectively with said first and second RF transistor devices; and
disabling said first pair of LO transistor devices while said second pair of LO transistor devices are enabled; and
means for outputting intermediate frequency (IF) signals produced by said two differential pairs.

29. The mixer circuit of claim 28 constructed substantially on a single integrated circuit substrate.

30. The mixer circuit of claim 28 further comprising means for processing a biasing signal for biasing said first and second RF transistor devices.

31. The mixer circuit of claim 30, wherein said means for processing said LO signal and said means for processing said biasing signal are performed by a single circuit comprising
  a limiting amplifier having:
    a pair of transistor devices connected as a differential pair;
    a constant current source connected to a coupling terminal of said pair of transistor devices;
    a pair of signal inputs for receiving an LO signal connected respectively to said pair of transistor devices;
    a plurality of load impedances connected respectively to said pair of transistor devices; and
    an output interface connected respectively to said pair of transistor devices and further connected to said LO input terminals;
  a plurality of biasing impedances connected to each other at a single node and further connected to said load impedances of said limiting amplifier at said single node;
  an output interface connected respectively to one of said biasing impedances and to said first and second RF input terminals; and
  a plurality of impedances:
    connected to each other in parallel; and
    further connected in series between said biasing impedances and said load impedances of said limiting amplifier and a supply voltage.

32. The mixer circuit of claim 31 constructed substantially on a single integrated circuit substrate.

33. The mixer circuit of claim 28, wherein said LO signals are an inverted/non-inverted signal pair.

34. The mixer circuit of claim 28, wherein said RF signals are an inverted/non-inverted signal pair.

35. The mixer circuit of claim 28, wherein said IF signals are an inverted/non-inverted signal pair.

36. A mixer circuit comprising
  two radio frequency (RF) transistors respectively connected in anti-series with two pairs of local oscillator (LO) transistors, wherein an RF input signal pair is inputted respectively into said RF transistors and an LO input signal pair is inputted respectively into said LO transistors causing said LO transistors to oscillate on and off, wherein said two RF transistors form two differential amplifiers with whichever ones of said LO transistors are on, said differential amplifiers producing an intermediate frequency (IF) output signal pair equal to a product of said RF and LO input signal pairs.

37. The mixer circuit of claim 36 constructed substantially on a single integrated circuit substrate.

38. The mixer circuit of claim 36 further comprising a plurality of constant current sources connected to said differential amplifiers and providing said differential amplifiers with a constant current.

39. The mixer circuit of claim 38 further comprising a plurality of load impedances connected to said LO transistors connected in anti-series with a first one of said two RF transistors.

40. The mixer circuit of claim 39 further comprising a plurality of shared impedances connected at the coupling terminals of said transistors of said differential amplifiers.

41. The mixer circuit of claim 40 constructed substantially on a single integrated circuit substrate.

42. The mixer circuit of claim 38 further comprising a plurality of load impedances connected to said LO transistors connected in anti-series with a second one of said two RF transistors.

43. The mixer circuit of claim 36 further comprising a circuit for providing a biasing signal to said RF transistors.

44. The mixer circuit of claim 36 further comprising a circuit for processing said LO signal pair.

45. The mixer circuit of claim 36 further comprising a circuit for providing a biasing signal to said RF transistors and processing said LO input signal pair.

46. The mixer circuit of claim 45 constructed substantially on a single integrated circuit substrate.

47. The mixer circuit of claim 36, wherein said LO signal pair is an inverted/non-inverted signal pair.

48. The mixer circuit of claim 36, wherein said RF signal pair is an inverted/non-inverted signal pair.

49. The mixer circuit of claim 36, wherein said IF signal pair is an inverted/non-inverted signal pair.

50. A mixer circuit comprising:
  a first local oscillator (LO) transistor having an input connected to a first LO output terminal for receiving LO signals;
  a second LO transistor having an input connected to a second LO input terminal for receiving LO signals;
  a radio frequency (RF) transistor:
    having an input connected to an RF input terminal for receiving RF signals; and
    connected in anti-series to said first and second LO transistors;
  a first intermediate frequency (IF) output terminal connected to an output of said first LO transistor, said first IF output terminal for outputting IF signals; and
  a second IF output terminal connected to an output of said second LO transistor, said second IF output terminal for outputting IF signals.

51. The mixer circuit of claim 50 constructed substantially on a single integrated circuit substrate.

52. The mixer circuit of claim 50 further comprising a biasing circuit for biasing RF transistor.

53. The mixer circuit of claim 52 constructed substantially on a single integrated circuit substrate.

54. The mixer circuit of claim 50 further comprising an LO signal generating circuit.

55. The mixer circuit of claim 54 constructed substantially on a single integrated circuit substrate.

56. The mixer circuit of claim 50 further comprising:
  a first constant current source connected to a common terminal of said RF transistor device; and
  a second constant current source connected to a coupling terminal of said first and second LO transistors.

57. The mixer circuit of claim 56 further comprising:
  a first shared impedance connected between said first and second constant current sources.

58. The mixer circuit of claim 57 further comprising:
  a first load impedance connected between said output of said first LO transistor and a supply voltage; and
  a second load impedance connected between said second LO transistor and said supply voltage.

59. The mixer circuit of claim 58 constructed substantially on a single integrated circuit substrate.

60. The mixer circuit of claim 50, wherein said transistor devices are MOS transistors.

61. The mixer circuit of claim 50, wherein said transistor devices are bipolar transistors.

62. The mixer circuit of claim 50, wherein said LO signals are an inverted/non-inverted signal pair.

63. The mixer circuit of claim 50, wherein said IF signals are an inverted/non-inverted signal pair.

64. A method for mixing signals comprising the steps of:

receiving a radio frequency (RF) signal;

processing a local oscillator (LO) signal to continuously alternate switching between:
   enabling a first LO transistor, wherein said first LO transistor is coupled in anti-series with an RF transistor, wherein said enabled first LO transistor forms a differential pair with said RF transistor;
   disabling a second LO transistor while said first LO transistor is enabled;
   enabling said second LO transistor, wherein said second LO transistor is coupled in anti-series with said RF transistor, wherein said enabled second LO transistor forms a differential pair with said first RF transistor; and
   disabling said first LO transistor while said second LO transistor is enabled; and outputting a signal produced by said two differential pairs.

65. The method of claim 64 performed substantially on a single integrated circuit substrate.

66. The method of claim 64 further comprising the step of processing a biasing signal to bias said RF transistor.

67. The method of claim 66, wherein said processing said LO signal step and said processing said biasing signal step are performed by a single circuit.

68. The method of claim 67 performed substantially on a single integrated circuit substrate.

69. The method of claim 64 further comprising the step of receiving a biasing signal.

\* \* \* \* \*